(12) United States Patent  (10) Patent No.: US 8,461,835 B2
Nomura  (45) Date of Patent: Jun. 11, 2013

(54) CURRENT SENSOR

(75) Inventor: Masatoshi Nomura, Miyagi-Ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 343 days.

(21) Appl. No.: 13/024,880

(22) Filed: Feb. 10, 2011

(65) Prior Publication Data

US 2011/0204889 A1 Aug. 25, 2011

(30) Foreign Application Priority Data

Feb. 23, 2010 (JP) ................................. 2010-037457

(51) Int. Cl.
*H02J 7/00* (2006.01)
(52) U.S. Cl.
USPC ............................. 324/252; 320/108; 320/134
(58) Field of Classification Search
USPC .................................. 324/252; 320/108, 134
See application file for complete search history.

(56) References Cited

U.S. PATENT DOCUMENTS 6,323,634 B1 * 11/2001 Nakagawa et al. ....... 324/117 R

FOREIGN PATENT DOCUMENTS

JP 2000-162248 6/2000

* cited by examiner

*Primary Examiner* — Bot Ledynh
(74) *Attorney, Agent, or Firm* — Beyer Law Group LLP

(57) ABSTRACT

A current sensor includes a magnetic equilibrium sensor including a magnetic sensor element with characteristics changed by an inductive magnetic field from a measurement target current and a feedback coil provided in the vicinity of the magnetic sensor element and generating a canceling magnetic field canceling the inductive magnetic field, a shunt resistor connected to a current line through which the measurement target current flows, and a switching unit switching between shunt resistor detection of sensing and outputting a voltage difference of the shunt resistor, and magnetic equilibrium detection of sensing and outputting a current flowing in the feedback coil in an equilibrium state where current flows in the feedback coil according to the inductive magnetic field and the inductive magnetic field and the canceling magnetic field cancel each other.

8 Claims, 6 Drawing Sheets

CURRENT SENSOR

CLAIM OF PRIORITY

This application claims benefit of Japanese Patent Application No. 2010-037457 filed on Feb. 23, 2010, which is hereby incorporated by reference.

BACKGROUND OF THE INVENTION

1. Field of the Invention

The present invention relates to a current sensor with high precision and low power consumption over a wide measurement range.

2. Description of the Related Art

An example of a current measuring device that measures current over a wide measurement range is disclosed in Japanese Unexamined Patent Application Publication No. 2000-162248. In the current measuring device, two high and low shunt resistors are connected in series and a diode is connected in parallel to a high shunt $R_L$ of a resistor for measuring small current. In such a current measuring device, in a state where a potential difference is equal to or more than $V_f$ (large current range), it is possible to reduce power consumption with the shunt $R_L$ as a bypass.

In the shunt resistor manner, when the measurement target current gets larger, power consumption gets higher in the current sensor, and the measurement range of the measurement target current gets narrower. In the current measuring device disclosed in Japanese Unexamined Patent Application Publication No. 2000-162248, the measurement range is widened using a plurality of shunt resistors, but in the large current range after the diode is turned on, the rated current in the shunt of the low resistor determines the upper limit of primary current, which is still a problem.

SUMMARY OF THE INVENTION

An advantage of some aspects of the invention is to provide a current sensor with high precision and low power consumption over a wide measurement range.

According to an aspect of the invention, there is provided a current sensor including: a magnetic equilibrium sensor including a magnetic sensor element with characteristics changed by an inductive magnetic field from a measurement target current and a feedback coil provided in the vicinity of the magnetic sensor element and generating a canceling magnetic field canceling the inductive magnetic field; a shunt resistor connected in series to a current line through which the measurement target current flows; and a switching unit switching between shunt resistor detection of sensing and outputting voltage difference of the shunt resistor, and magnetic equilibrium detection of sensing and outputting current flowing in the feedback coil in an equilibrium state where current flows in the feedback coil according to the inductive magnetic field, and the inductive magnetic field and the canceling magnetic field cancel each other.

With such a configuration, when the measurement target current is small, it is possible to stop the feedback current of the magnetic equilibrium detection by switching to measurement based on the shunt resistor detection. Accordingly, it is possible to suppress power consumption when the measurement target current is small.

In the current sensor according to the aspect of the invention, it is preferable that two magnetic equilibrium sensors are disposed with a current line allowing the measurement target current to flow interposed therebetween, and sensitivity axis directions of the magnetic sensor elements of the two magnetic equilibrium sensors are the same. With such a configuration, the influence of an external magnetic field such as geomagnetism is canceled by the differential output of two magnetic equilibrium sensors, and thus it is possible to measure a current with higher precision.

In the current sensor according to the aspect of the invention, it is preferable that the magnetic sensor element is a magnetoresistance effect element. With such a configuration, it is easy to provide a sensitivity axis in a direction parallel to the substrate face on which the current sensor is provided, and it is possible to use a planar coil.

In the current sensor according to the aspect of the invention, it is preferable that the switching unit switches from the shunt resistor detection to the magnetic equilibrium detection in detection target current Ieq in which power consumption PM of the magnetic equilibrium detection and power consumption PS of the shunt resistor detection are the same. With such a configuration, since the measurement target current Ieq in which the power consumption PM of the magnetic equilibrium detection and the power consumption PS of the shunt resistor detection are the same is the threshold value, it is possible to switch to measurement based on a detection mode with lower power consumption, and it is possible to stop or separate the unused detection mode while suppressing power consumption of the sensor unit.

In the current sensor according to the aspect of the invention, it is preferable that the power consumption PS of the shunt resistor detection is lower than the rated power PSmax of the shunt resistor in the measurement target current Ieq. With such a configuration, it is possible to make the shunt resistor be in an unused state before exceeding the rated value, and thus it is possible to detach and protect the shunt resistor.

In the current sensor according to the aspect of the invention, it is preferable that the magnetoresistance effect element is a GMR element, and the measurement target current Ieq is set such that a magnetic field caused by the measurement target current Ieq is smaller than a saturation magnetic field of the GMR element. With such a configuration, it is possible to use the GMR element in a non-magnetic-saturation state.

In the current sensor according to the aspect of the invention, it is preferable that the switching unit turns on or off the feedback current by a current value smaller than the measurement target current Ieq as a threshold value. With such a configuration, a degree of freedom is generated in a bypass method of the shunt resistor, and it is possible to provide hysteresis such that switching of the current sensor does not frequently occur.

According to another aspect of the invention, there is provided a battery including a battery body having a current line, and the current sensor provided on the current line.

According to the current sensor of the aspect of the invention, a current sensor includes a magnetic equilibrium sensor including a magnetic sensor element with characteristics changed by an inductive magnetic field from a measurement target current and a feedback coil provided in the vicinity of the magnetic sensor element and generating a canceling magnetic field canceling the inductive magnetic field; a shunt resistor connected in series to a current line through which the measurement target current flows; and a switching unit switching between shunt resistor detection of sensing and outputting a voltage difference of the shunt resistor, and magnetic equilibrium detection of sensing and outputting current flowing in the feedback coil in an equilibrium state where current flows in the feedback coil according to the inductive magnetic field and the inductive magnetic field and the canceling magnetic field cancel each other. Accordingly, it is possible to measure a current with high precision and low power consumption over a wide measurement range.

DESCRIPTION OF THE PREFERRED EMBODIMENTS

A magnetic equilibrium current sensor using a magnetoresistance effect element has a configuration more complex than a magnetic proportional current sensor, but it is possible to measure a measurement target current over a wide measurement range with high precision. However, it is necessary to allow current to flow in a feedback coil, and thus power consumption is high when the measurement target current is small, as compared with other methods such as shunt resistors.

The inventors paid attention to the point and have made the invention capable of measuring current with high precision and low power consumption over a wide measurement range by switching magnetic equilibrium detection and shunt resistor detection to reduce power consumption as much as possible. Particularly, the shunt resistor detection is used when a relatively small current is measured, and thus it is possible to reduce power consumption.

That is, the main point of the invention is to measure a current with high precision and low power consumption over a wide measurement range by a current sensor including a magnetic equilibrium sensor including a magnetic sensor element with characteristics changed by the inductive magnetic field from the measurement target current and a feedback coil provided in the vicinity of the magnetic sensor element and generating a canceling magnetic field canceling the inductive magnetic field, a shunt resistor connected to a current line through which the measurement target current flows, and a switching unit switching between shunt resistor detection of sensing and outputting voltage difference of the shunt resistor, and magnetic equilibrium detection of sensing and outputting current flowing in the feedback coil in an equilibrium state where current flows in the feedback coil according to the inductive magnetic field, and the inductive magnetic field and the canceling magnetic field cancel each other.

Hereinafter, embodiments of the invention will be described with reference to the accompanying drawings.

Figure 1:
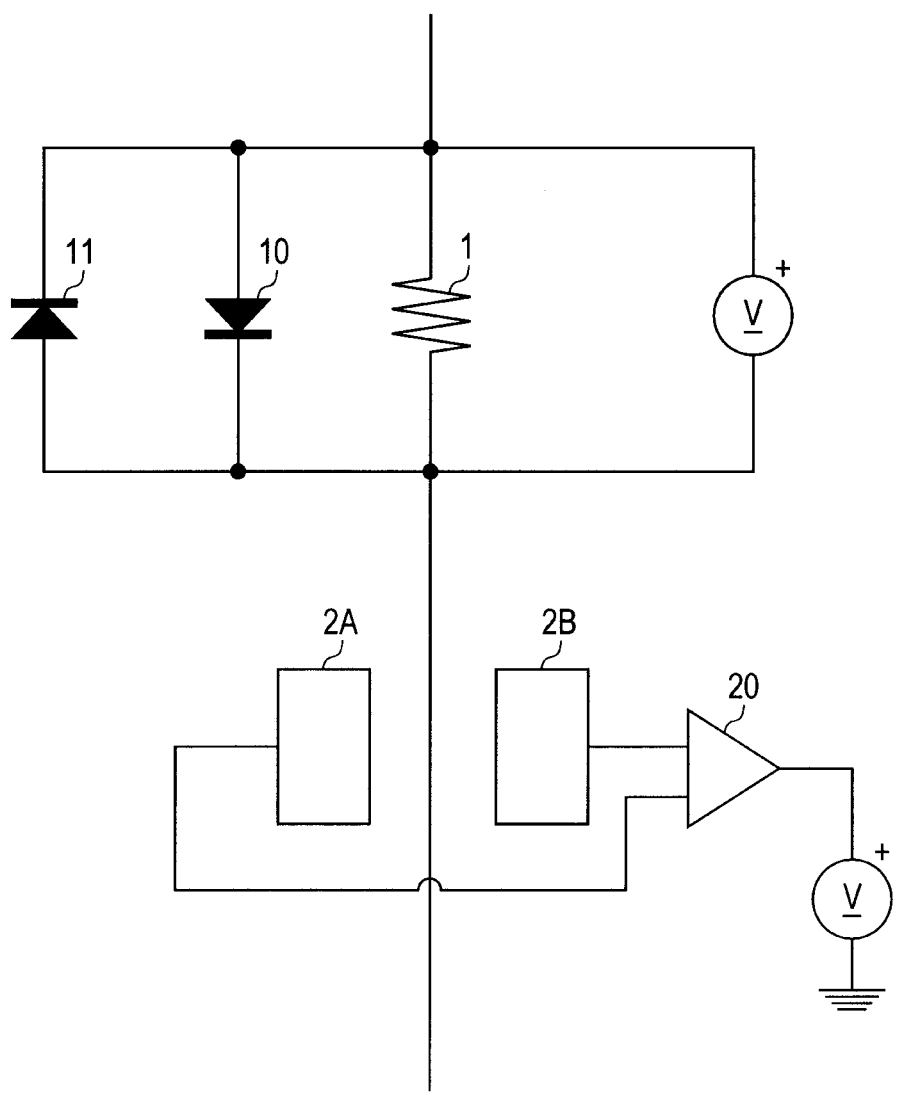
FIG. 1 is circuit diagram illustrating a current sensor according to an embodiment of the invention.

FIG. 1 is a circuit diagram illustrating a current sensor according to an embodiment of the invention. In the embodiment, the current sensor shown in FIG. 1 is provided in the vicinity of a current line through which a measurement target current flows. The current sensor mainly includes a pair of magnetic equilibrium current sensors 2A and 2B, and a shunt resistor 1 connected in series to the magnetic equilibrium current sensors 2A and 2B with respect to the current line. Diodes 10 and 11 are connected in parallel to the shunt resistor 1 for bypassing current at the time of large current. The diodes 10 and 11 are connected to each other with reverse polarity, and bypass current when a voltage applied to the shunt resistor 1 exceeds a threshold value voltage in the forward direction of any of the diodes, thereby reducing power consumption in the shunt resistor 1. The magnetic equilibrium current sensors 2A and 2B are connected to a differential amplifier 20 differentially amplifying outputs of the sensors.

Figure 2:
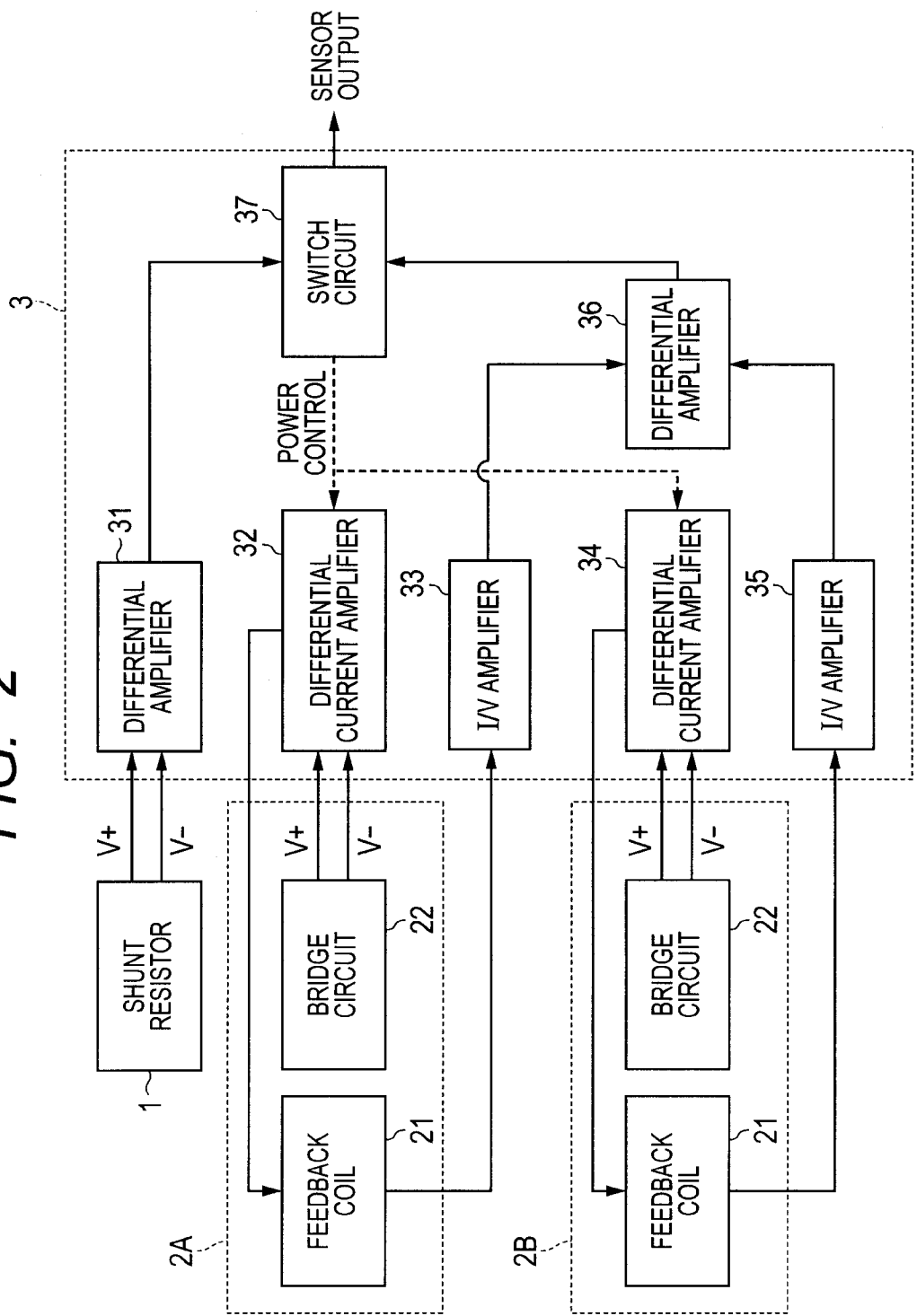
FIG. 2 is a block diagram illustrating the current sensor according to the embodiment of the invention.

FIG. 2 is a block diagram illustrating the current sensor according to the embodiment of the invention. The current sensor shown in FIG. 2 includes the shunt resistor (shunt resistor current sensor) 1, the magnetic equilibrium current sensors 2A and 2B, and a control unit 3. The magnetic equilibrium current sensors 2A and 2B are disposed with a current line allowing a measurement target current to flow interposed therebetween, and sensitivity axis directions of magnetoresistance effect elements in two magnetic equilibrium current sensors 2A and 2B are the same.

Each of the magnetic equilibrium current sensors 2A and 2B includes a feedback coil 21 provided to generate a magnetic field in a direction canceling the magnetic field generated by the measurement target current, and a bridge circuit 22 formed of two magnetoresistance effect elements that are magnetic detecting elements and two fixed resistor elements. The control unit 3 includes a differential amplifier 31 amplifying the differential output of the shunt resistor 1, a differential current amplifier 32 amplifying the differential output of the bridge circuit 22 of the magnetic equilibrium current sensor 2A and controlling the feedback current of the feedback coil 21 of the magnetic equilibrium current sensor 2A, an I/V amplifier 33 converting the feedback current of the magnetic equilibrium current sensor 2A into voltage, a differential current amplifier 34 amplifying the differential output of the bridge circuit 22 of the magnetic equilibrium current sensor 2B and controlling feedback current of the feedback coil 21 of the magnetic equilibrium current sensor 2B, an I/V amplifier 35 converting the feedback current of the magnetic equilibrium current sensor 2B into voltage, a differential amplifier 36 amplifying the differential output of the I/V amplifiers 33 and 35, and a switch circuit 37 changing the shunt resistor detection and the magnetic equilibrium detection.

The feedback coil 21 is provided in the vicinity of the magnetoresistance effect element of the bridge circuit 22, and generates the canceling magnetic field canceling the inductive magnetic field generated by the measurement target current. The magnetoresistance effect element of the bridge circuit 22 may be a GMR (Giant Magneto Resistance) element or a TMR (Tunnel Magneto Resistance) element. The resistance value of the magnetoresistance effect element is changed by the inductive magnetic field applied by the measurement target current. Since the bridge circuit 22 is configured by two magnetoresistance effect elements and two fixed resistance elements, it is possible to realize a high-sensitivity current sensor. Since the magnetoresistance effect elements are used, it is easy to provide the sensitivity axis in a direction parallel to the substrate face on which the current sensor is provided, and it is possible to use a planar coil.

The bridge circuit 22 is provided with two outputs causing a voltage difference corresponding to the inductive magnetic field generated by the measurement target current. Two outputs of the bridge circuit 22 are amplified by the differential current amplifiers 32 and 34. In a case of a magnetic equilibrium detection mode (equilibrium mode), the amplified outputs are given to the feedback coil 21 as current (feedback current). The feedback current corresponds to the voltage difference corresponding to the inductive magnetic field. In this case, the canceling magnetic field canceling the inductive magnetic field is generated in the feedback coil 21. In the equilibrium state in which the inductive magnetic field and the canceling magnetic field are canceled, the current flowing in the feedback coil 21 is converted into voltage by the I/V amplifiers 33 and 35, and the voltages are sensor outputs. In the differential amplifier 36, with respect to current, the differential value of the outputs of the I/V amplifiers 33 and 35 are processed as sensor outputs. Accordingly, the sensitivity axis directions of the magnetoresistance effect elements of two magnetic equilibrium current sensor 2A and 2B are the same, the influence of an external magnetic field such as geomagnetism is canceled, and thus it is possible to measure a current with high precision.

In the differential current amplifiers 32 and 34, power supply voltage is set to a value close to a reference voltage of I/V conversion+(maximum value within the rating of the feedback coil resistor×full-scale feedback current), the feedback current is automatically restricted, and thus it is possible to obtain an effect of protecting the magnetoresistance effect element or the feedback coil. The difference of two outputs of the bridge circuit 22 is amplified and used in the feedback current, but only a center potential may be output from the bridge circuit and may be a feedback current on the basis of the potential difference from a predetermined reference potential.

The switch circuit 37 switches the shunt resistor detection of sensing and outputting the voltage difference from the differential amplifier 31, and the magnetic equilibrium detection of sensing and outputting the voltage difference from the differential amplifier 36. As described above, the switch circuit 37 controls power supply at the time of the equilibrium mode, that is, outputs control signals for power supply control to the differential current amplifiers 32 and 34, to cause the magnetic field (canceling magnetic field) canceling the inductive magnetic field caused by the measurement target current flowing in the current line, and performs circuit control without causing the canceling magnetic field at the time of the shunt resistor mode. That is, the switch circuit 37 changes the ON/OFF state of the feedback current of the magnetic equilibrium detection mode.

As described above, in the magnetic equilibrium current sensor using the magnetoresistance effect element, power consumption is high when the measurement target current is small as compared with other methods such as shunt resistors. Accordingly, to widen the measurement range and to reduce the power consumption, it is preferable that the shunt resistor detection is used in an area of relatively low measurement target current and the magnetic equilibrium detection is used in an area of relatively high measurement target current.

Accordingly, the switch circuit 37 determines a threshold value with respect to the measurement target current to change the shunt resistor detection and the magnetic equilibrium detection (mode change). Specifically, the shunt resistor detection is performed in the low measurement target current, and the magnetic equilibrium detection is performed in the measurement target current higher than that.

When the measurement target current becomes larger to some extent and the voltage applied to the shunt resistor 1 is over the threshold voltage of the diodes 10 and 11, the measurement target current mainly flows in the diodes 10 and 11, and only a part of the measurement target current flows in the shunt resistor 1. Accordingly, in the shunt resistor detection, it is difficult to perform accurate measurement. For this reason, the threshold value of the detection mode switching is set less than a current value exceeding the threshold value voltage. It is preferable to switch from the shunt resistor detection to the magnetic equilibrium detection in the measurement target current Ieq in which the power consumption PM of the magnetic equilibrium detection and the power consumption PS of the shunt resistor detection are the same. Accordingly, since the measurement target current Ieq in which the power consumption PM of the magnetic equilibrium detection and the power consumption PS of the shunt resistor detection are the same is the threshold value, it is possible to switch to measurement based on a detection mode with lower power consumption, and it is possible to stop or separate the unused detection mode while suppressing power consumption of the sensor unit.

It is preferable that the power consumption PS of the shunt resistor detection is lower than the rated power PSmax of the shunt resistor in the measurement target current Ieq. Accordingly, it is possible to make the shunt resistor be in an unused state before exceeding the rated value, and thus it is possible to detach and protect the shunt resistor. It is preferable that the magnetoresistance effect element is a GMR element, and the measurement target current Ieq is set such that the magnetic field caused by the measurement target current Ieq is smaller than the saturation magnetic field of the GMR element. Accordingly, it is possible to use the GMR element in a non-magnetic-saturation state.

It is preferable that the switch circuit 37 turns on or off the feedback current by a current value smaller than the measurement target current Ieq as a threshold value. Accordingly, a degree of freedom is generated in a bypass method of the shunt resistor 1, and it is possible to provide hysteresis such that switching of the current sensor does not frequently occur.

Figure 3:
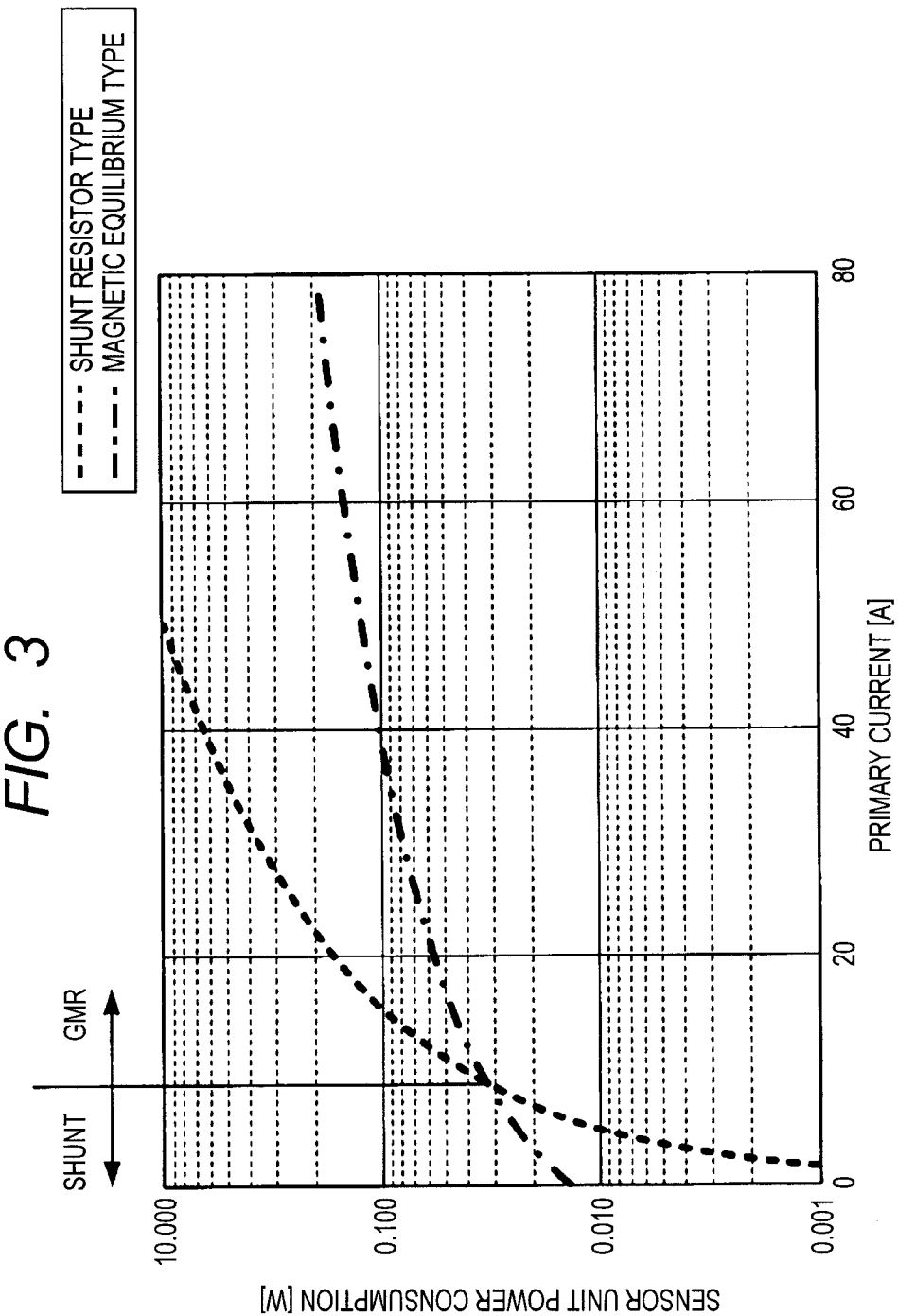
FIG. 3 is a diagram illustrating an example of power consumption of a shunt resistor current sensor and a magnetic equilibrium current sensor.
Figure 4:
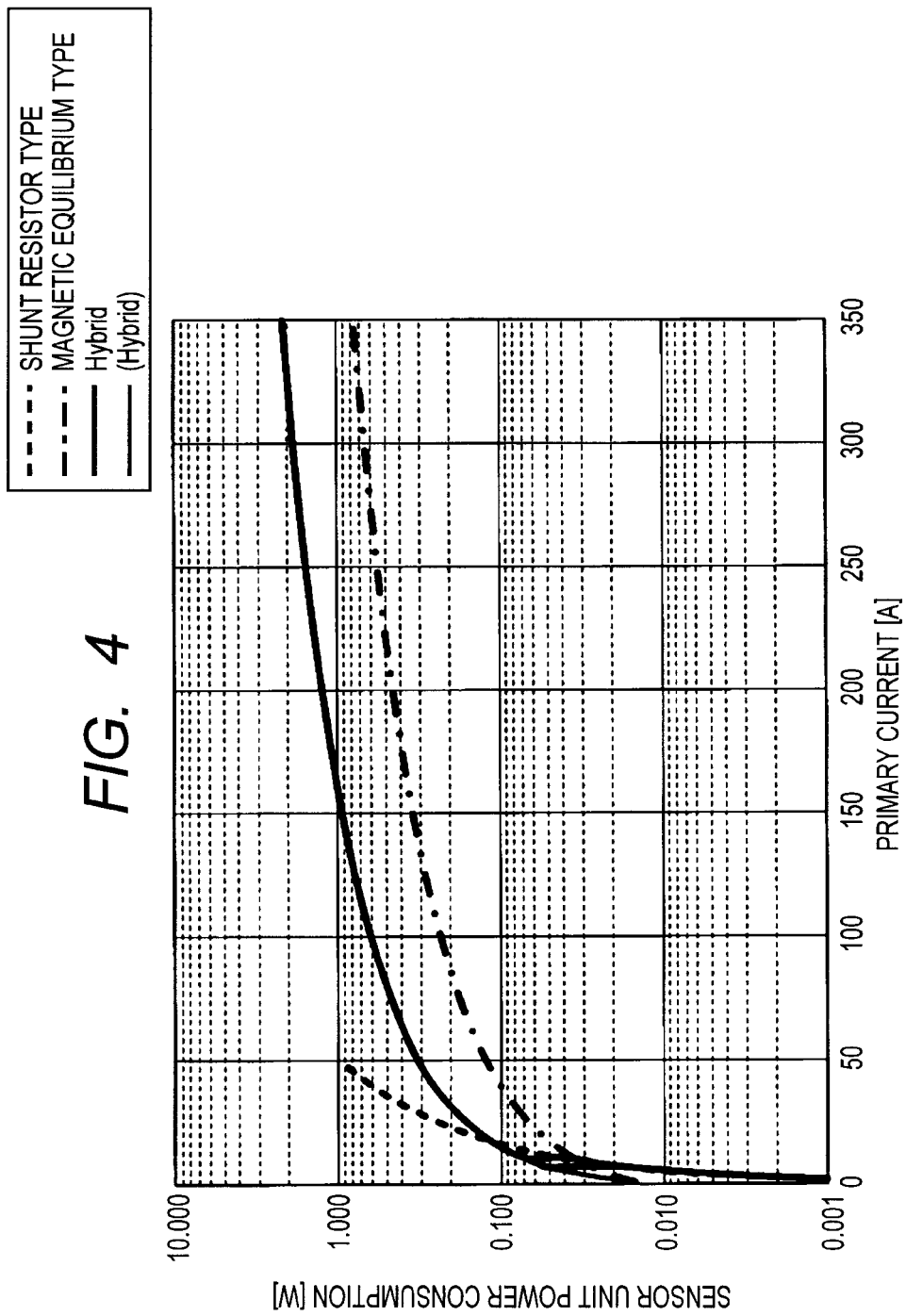
FIG. 4 is a diagram illustrating an example of power consumption of the current sensor according to the embodiment of the invention.
Figure 5:
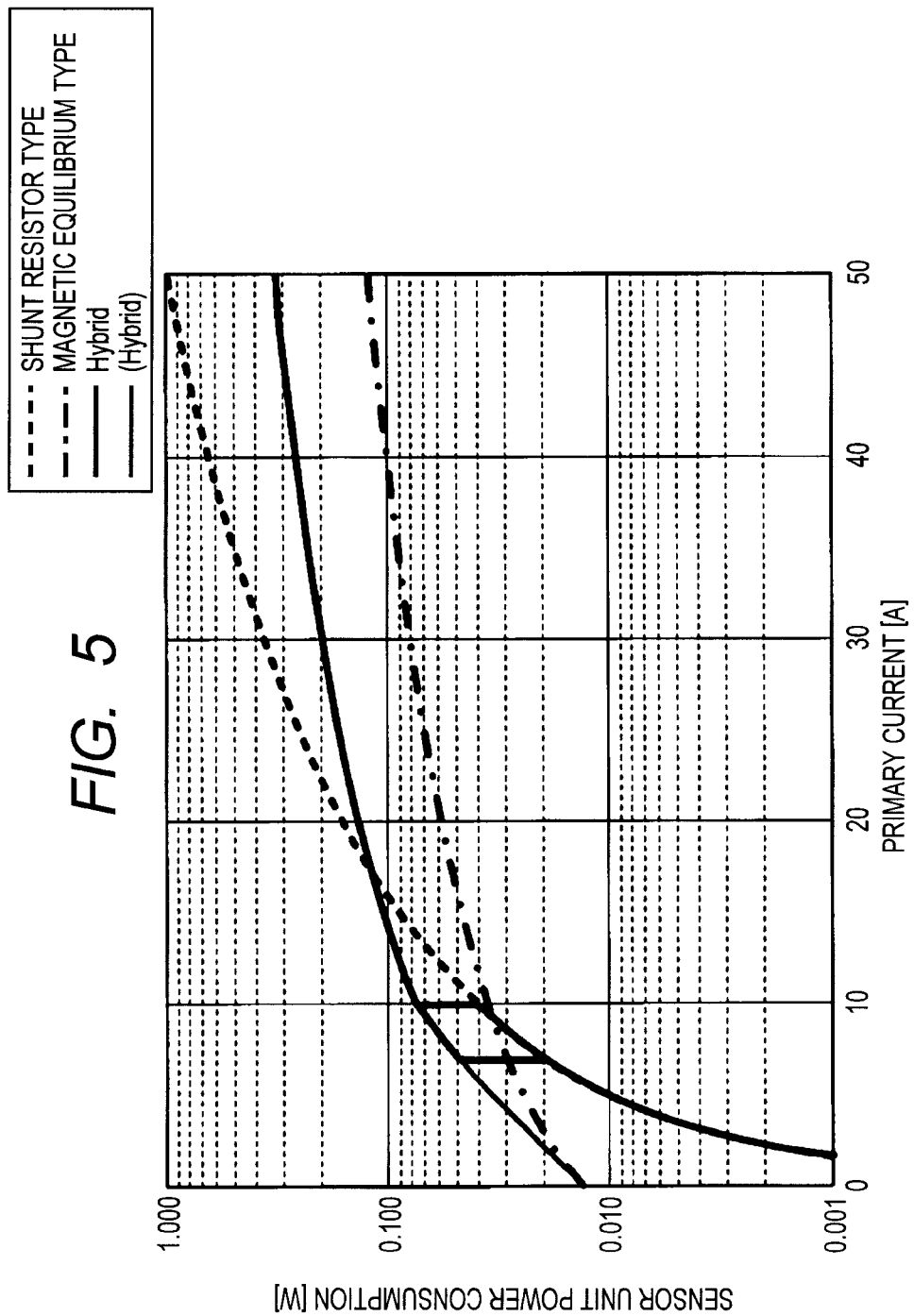
FIG. 5 is a diagram illustrating an example of power consumption of the current sensor according to the embodiment of the invention.

Hereinafter, an example of changing the shunt resistor detection and the magnetic equilibrium detection using the current sensor of the invention will be described. FIG. 3 shows an example of power consumption of the magnetic equilibrium current sensor (magnetic equilibrium type) using the GMR element and the current sensor (shunt resistor type) using the shunt resistor. For example, when the shunt resistor is 400 μΩ, as shown in FIG. 3, power consumption of the shunt resistor type and the power consumption of the magnetic equilibrium type are the same substantially at 10 A. In this case, when bypassing of the shunt is generated by a diode at a shunt voltage of 4 mV, in the large current area thereafter, as shown in FIG. 4 and FIG. 5, the original power of the magnetic equilibrium type+ the power consumption caused by the diode is consumed by the sensor unit. The rating of the shunt resistor is generally about 1 W, and it is difficult to use it without increase of size or sufficient heat emission in a current range more than that. From this viewpoint, it is possible to provide the current sensor with low power consumption (small size) and a wide measurement range through the configuration of the invention.

An example of applying the current sensor of the invention to a battery current sensor of an electric vehicle or a hybrid car is considered as an example in which the large current mode and the other small current mode at the operating time are clearly separated. For example, a rating of a motor mounted on the hybrid car is 60 kW, a battery is 28 series, and voltage is 201.6 V. In this case, battery current of 300 A flows during rated running of the motor. Meanwhile, when stopped, power consumption is mainly caused by electric components, total power consumption thereof is 87 A (12 V), which is about 5 A as battery current based on current-voltage conversion.

As a threshold value for changing the current sensor from the shunt resistor detection to the magnetic equilibrium detection, first, 10 A, in which the current consumption of the magnetic equilibrium detection is smaller than the current consumption of the shunt resistor detection, is selected. It is a value sufficiently larger than 5 A and sufficiently smaller than 300 A. On the contrary, as the threshold value switched from the magnetic equilibrium detection to the shunt resistor detection, hysteresis is provided to avoid frequent switching and it is preferable to select, for example, 7 A appropriately far away from 10 A and 5 A.

In this condition, power consumption of the current sensor (Hybrid) of the invention is shown in FIG. 4 and FIG. 5. FIG. 5 is an enlarged diagram of the switching part in FIG. 4. As can be seen from FIG. 4 and FIG. 5, the switching of the detection mode is performed using the measurement target current of 10 A as the threshold value, and thus it is possible to reduce power consumption when the measurement target current is small such as when the vehicle is stopped with the advantage of the wide measurement range and high precision of the magnetic equilibrium detection.

In the case of a hybrid car, the current of the battery is direct current, but the configuration of the invention can be applied to a case of measuring alternating current such as home power supply. For example, in a case of characteristics shown in FIG. 4 and FIG. 5, the threshold value of the switching of the detection mode in this case may be set in such a manner of switching to the magnetic equilibrium when exceeding 10 A in which the current consumption of the magnetic equilibrium detection is less than the current consumption of the shunt resistor detection in the maximum value (peak value) of the current. On the contrary, when the maximum value of the current is less than the current range of the power-saving mode, for example, 7 A, it switches to the shunt resistor type. In the case of the direct current, the difference in the mode switching control is a determination based on the maximum value of alternating current fluctuation, and all the time of a current value equal to or less than 7 A in the alternating current fluctuation period is operated as the magnetic equilibrium type while operating as the magnetic equilibrium detection. Explaining this case on the graph (FIG. 5) of the power consumption, during the operation as the magnetic equilibrium type (the maximum value of the current is 10 A or more), it operates at a power as the magnetic equilibrium detection+ the shunt resistor detection even when an instantaneous value of the measurement target current is 7 A or less. Accordingly, it is possible to prevent frequent turning ON/OFF of the feedback current and to obtain an effect of prompt tracing in change of larger current. Meanwhile, when the threshold value for switching to the shunt resistor type, for example, 7 A can be appropriately set, it is possible to obtain an effect of suppressing the current consumption as the original purpose in the power-saving mode even when the effect of suppressing the current consumption is decreased during the operation of the magnetic equilibrium detection.

As described above, according to the current sensor of the invention, the switching is performed such that the shunt resistor detection and the magnetic equilibrium detection are used in the measurement target current area where each current consumption becomes low, and thus it is possible to achieve both a wide measurement range based on the magnetic equilibrium type and power savings. Since the sensitivity axis of the magnetoresistance effect element is the in-face direction, it is possible to form a coil just beside of the magnetoresistance effect element in the production process of the current sensor. As a result, there is an advantage of taking a configuration in which magnetic field canceling of the magnetic field caused by large current can be generated by a relatively small feedback current.

Battery Using Current Sensor

A battery using the current sensor of the invention includes a battery body provided with a current line, and a current sensor mounted on the current line. In the battery having such a configuration, a case of performing management of the battery using a charge and discharge control (battery management system) will be described.

Figure 6:
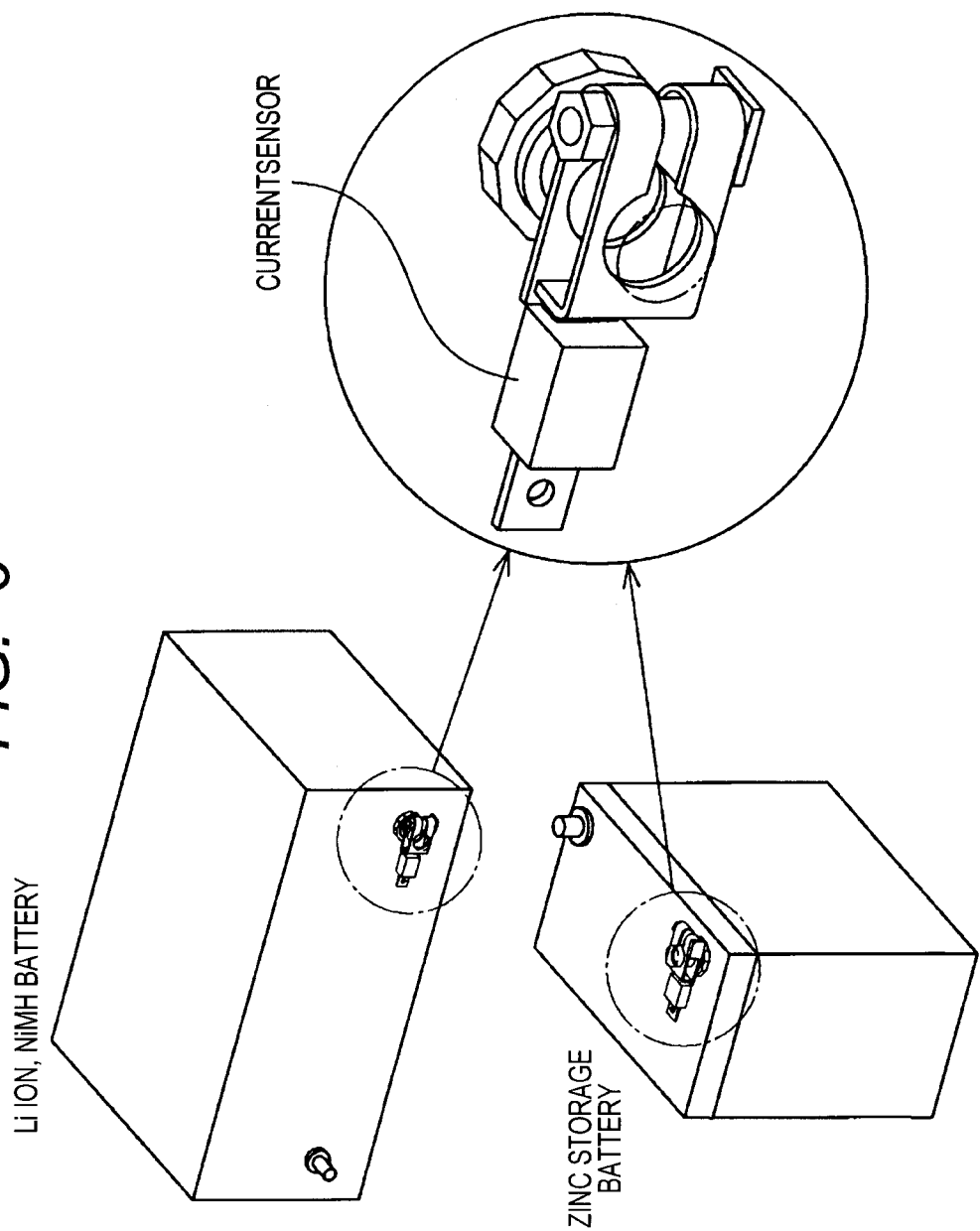
FIG. 6 is a diagram illustrating a use range of a battery when the current sensor according to the embodiment of the invention is applied to the battery.

The current sensor according to the embodiment may be provided in the battery to manage the battery. Specifically, as shown in FIG. 6, the current sensor is provided at a terminal (plus or minus) of a battery performing charge and discharge of a battery such as a Li ion battery, a NiMH battery, and a lead storage battery, and the charge and discharge currents are measured using the current sensor and integrated, thereby managing the amount remaining in the battery.

Although the current values flowing in the battery during use time and non-use time are greatly different, it is possible to detect the amount of current during use and non-use with high precision through one current sensor, using the current sensor according to the embodiment, that is, the shunt resistor detection is performed when the measurement target current is low and the magnetic equilibrium detection is performed when the measurement target current is high. Since an integration error can be reduced by measuring the current value of the battery with high precision, it is possible to reduce a margin provided in the battery to prevent overcharge and overdischarge. As a result, it is possible to efficiently use the battery, for example, it is possible to extend driving mileage by applying the current sensor according to the embodiment to the battery of electric vehicles.

The invention is not limited to the embodiment, and may be variously modified. For example, in the embodiment, the case of using the shunt resistor and two magnetic equilibrium current sensors has been described, but the invention is not limited thereto; the current sensor may be configured using the shunt resistor and one magnetic equilibrium current sensor considering the simplification of the configuration or miniaturization, and the current sensor may be configured using the shunt resistor and three or more magnetic equilibrium current sensors considering differential balance or the like. The connection relation and size of the elements in the embodiment may be appropriately modified. In the embodiment, the case of using the magnetoresistance effect element for the magnetic equilibrium current sensor has been described, but a Hall element or other magnetic detection elements may be used for the magnetic equilibrium current sensor. The invention may be appropriately modified within the scope of the invention.

The invention is applicable to a current sensor detecting the magnitude of a current for driving the motor of an electric vehicle or a hybrid car.

It should be understood by those skilled in the art that various modifications, combinations, sub-combinations and alterations may occur depending on design requirements and other factors insofar as they are within the scope of the appended claims or the equivalents thereof.

What is claimed is:
1. A current sensor comprising:
a magnetic equilibrium sensor including a magnetic sensor element with characteristics changed by an inductive magnetic field from a measurement target current and a feedback coil provided in the vicinity of the magnetic sensor element and generating a canceling magnetic field canceling the inductive magnetic field;

a shunt resistor connected in series to a current line through which the measurement target current flows; and a switching unit switching between shunt resistor detection of sensing and outputting voltage difference of the shunt resistor, and magnetic equilibrium detection of sensing and outputting current flowing in the feedback coil in an equilibrium state where current flows in the feedback coil according to the inductive magnetic field, and the inductive magnetic field and the canceling magnetic field cancel each other.

2. The current sensor according to claim 1, wherein two magnetic equilibrium sensors are disposed with a current line allowing the measurement target current to flow interposed therebetween, and sensitivity axis directions of the magnetic sensor elements of the two magnetic equilibrium sensors are the same.

3. The current sensor according to claim 1, wherein the magnetic sensor element is a magnetoresistance effect element.

4. The current sensor according to claim 1, wherein the switching unit switches from the shunt resistor detection to the magnetic equilibrium detection in detection target current $I_{eq}$ in which power consumption $P_M$ of the magnetic equilibrium detection and power consumption $P_S$ of the shunt resistor detection are the same.

5. The current sensor according to claim 4, wherein the power consumption $P_S$ of the shunt resistor detection is lower than the rated power $P_{Smax}$ of the shunt resistor in the measurement target current $I_{eq}$.

6. The current sensor according to claim 4, wherein the magnetoresistance effect element is a GMR element, and the measurement target current $I_{eq}$ is set such that magnetic field caused by the measurement target current $I_{eq}$ is smaller than saturation magnetic field of the GMR element.

7. The current sensor according to claim 4, wherein the switching unit turns on or off the feedback current by a current value smaller than the measurement target current $I_{eq}$ as a threshold value.

8. A battery comprising:

a battery body including a current line; and the current sensor according to claim 1 provided on the current line.

* * * * *